(12) United States Patent
Gutsche et al.

(10) Patent No.: US 7,074,689 B2
(45) Date of Patent: Jul. 11, 2006

(54) METHOD FOR FABRICATING A TRENCH CAPACITOR HAVING AN INSULATION COLLAR, WHICH IS ELECTRICALLY CONNECTED TO A SUBSTRATE ON ONE SIDE VIA A BURIED CONTACT, IN PARTICULAR FOR A SEMICONDUCTOR MEMORY CELL

(75) Inventors: Martin Gutsche, Dorfen (DE); Harald Seidl, Poring (DE)

(73) Assignee: Infineon Technologies AG, Munich (DE)

( * ) Notice: Subject to any disclaimer, the term of this patent is extended or adjusted under 35 U.S.C. 154(b) by 95 days.

(21) Appl. No.: 10/935,520

(22) Filed: Sep. 7, 2004

(65) Prior Publication Data

US 2005/0070066 A1 Mar. 31, 2005

(30) Foreign Application Priority Data

Sep. 29, 2003 (DE) ................. 103 45 162

(51) Int. Cl.
*H01L 21/20* (2006.01)
(52) U.S. Cl. ..................... 438/386; 257/303
(58) Field of Classification Search ............... 257/296, 257/301, 303, 306; 438/243, 244, 239, 386
See application file for complete search history.

(56) References Cited

U.S. PATENT DOCUMENTS 6,291,286 B1 9/2001 Hsiao
2001/0042880 A1 11/2001 Divakaruni et al.
2005/0026384 A1* 2/2005 Kudelka et al. ............. 438/386
2005/0191564 A1* 9/2005 Huang et al. ................... 430/5

FOREIGN PATENT DOCUMENTS

DE 102 55 846 A1 4/2004

* cited by examiner

*Primary Examiner*—David Nelms
*Assistant Examiner*—Calvin Lee
(74) *Attorney, Agent, or Firm*—Jenkins, Wilson, Taylor & Hunt, P.A.

(57) ABSTRACT

The present invention provides a method for fabricating a trench capacitor having an insulation collar (10; 10a, 10b) in a substrate (1), which is electrically connected to the substrate (1) on one side via a buried contact (15a, 15b), in particular for a semiconductor memory cell having a planar select transistor which is provided in the substrate (1) and is connected via the buried contact (15a, 15b), comprising the steps of: providing a trench (5) in the substrate (1) using a hard mask (2, 3) with a corresponding mask opening; providing a capacitor dielectric (30) in the lower and middle regions of the trench, the insulation collar (10) in the middle and upper regions of the trench and an electrically conductive filling (20) at least up to the top side of the insulation collar (10); completely filling the trench (5) with a filling material (50; 50'; 50"; 20); carrying out an STI trench production process; removing the filling material (50; 50'; 50"; 20) and lowering the electrically conductive filling (20) to below the top side of the insulation collar (10); forming an insulation region (IS; IS1, IS2) on one side with respect to the substrate (1) above the insulation collar (10); uncovering a connection region (KS; KS1, KS2) on the other side with respect to the substrate (1) above the insulation collar (10); and forming the buried contact (15a, 15b) by depositing and etching back a C filling (70; 70'; 70"; 70''').

10 Claims, 21 Drawing Sheets

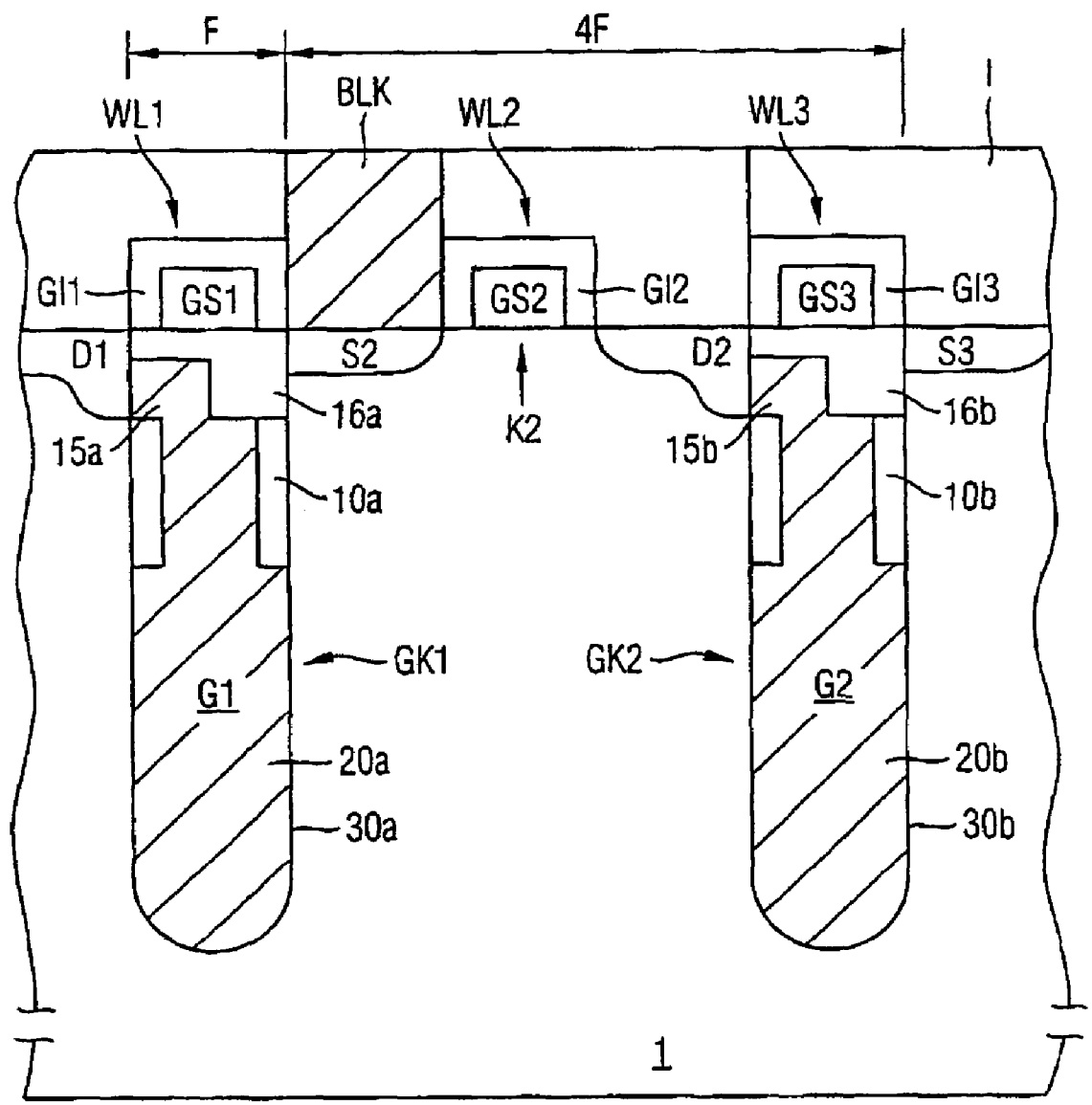

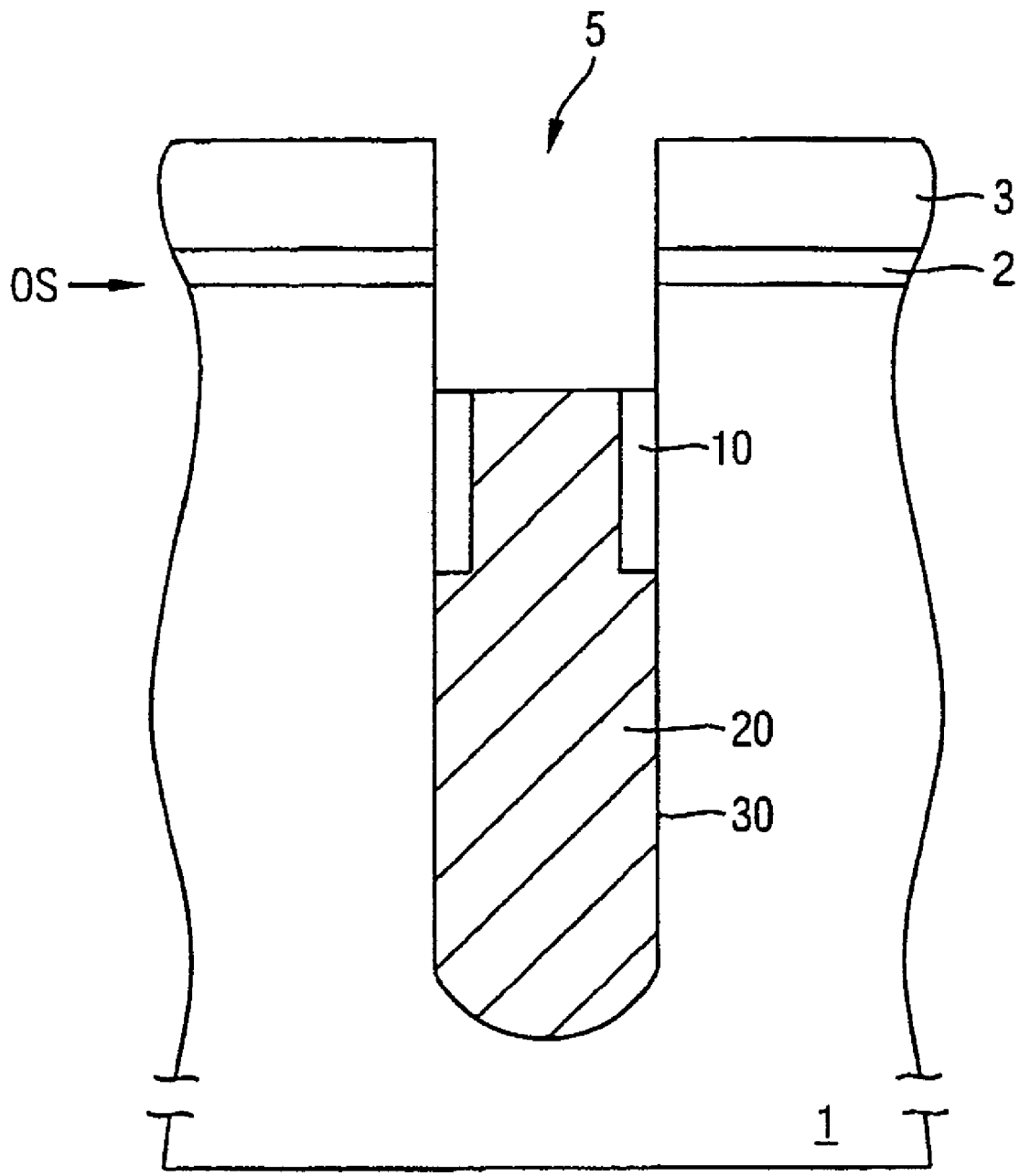

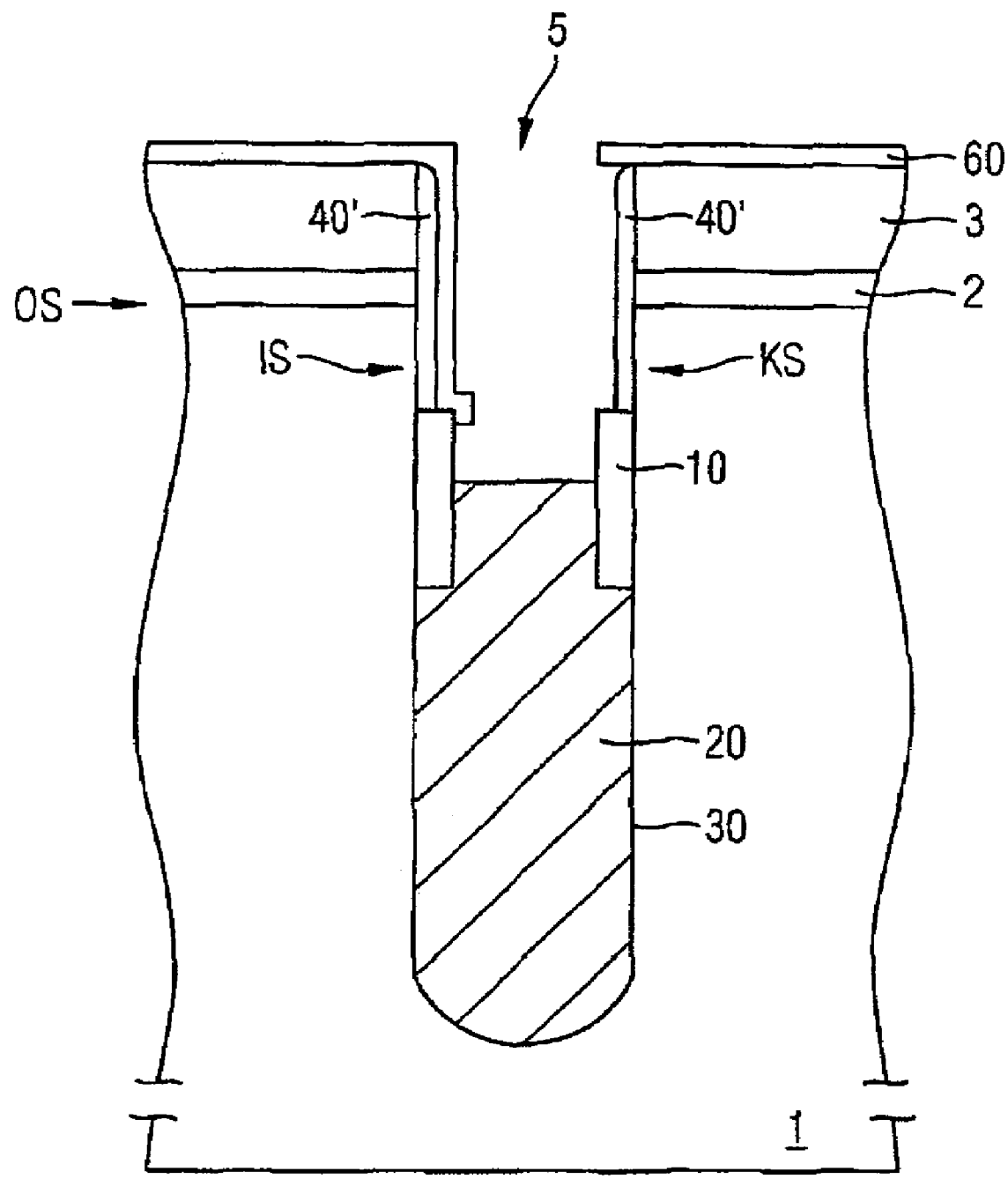

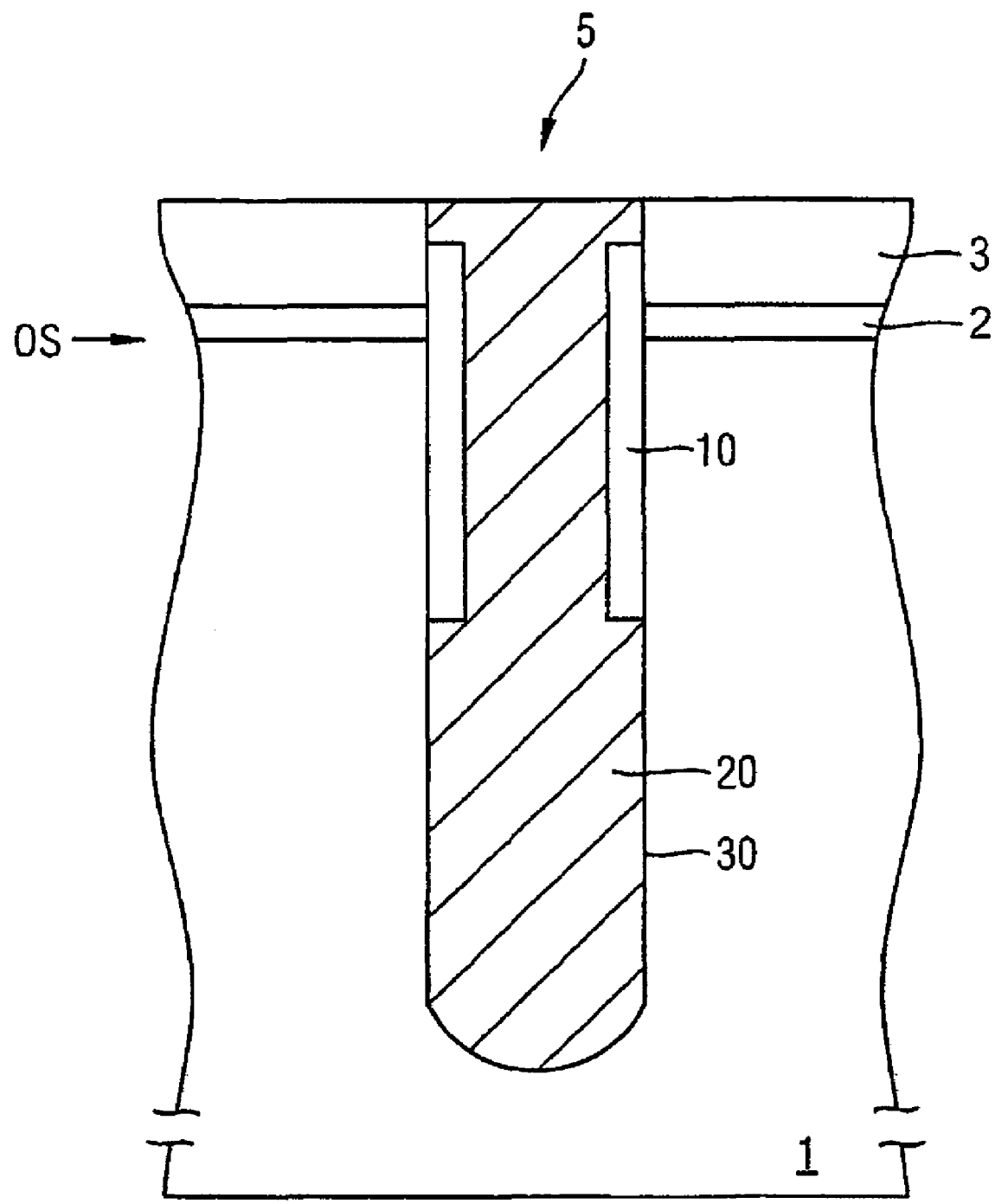

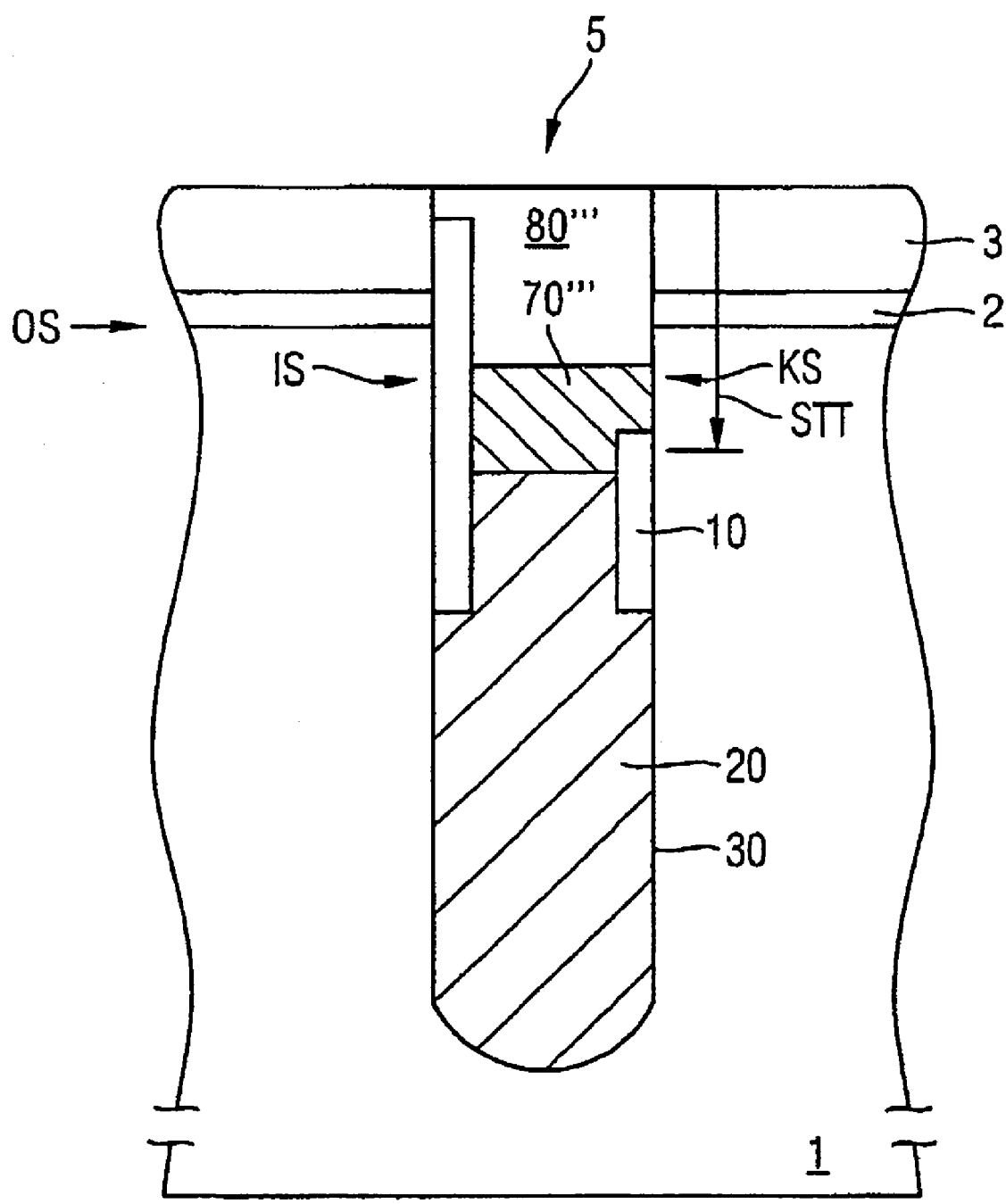

METHOD FOR FABRICATING A TRENCH CAPACITOR HAVING AN INSULATION COLLAR, WHICH IS ELECTRICALLY CONNECTED TO A SUBSTRATE ON ONE SIDE VIA A BURIED CONTACT, IN PARTICULAR FOR A SEMICONDUCTOR MEMORY CELL

TECHNICAL FIELD

The present invention relates to a method for fabricating a trench capacitor having an insulation collar, which is electrically connected to a substrate on one side via a buried contact, in particular for a semiconductor memory cell.

BACKGROUND ART

Although they can in principle be applied to any desired integrated circuits, the present invention and the problems on which it is based are explained with reference to integrated memory circuits in silicon technology.

FIG. 1 shows a diagrammatic sectional view through a semiconductor memory cell having a trench capacitor and a planar select transistor connected to it.

In FIG. 1, reference numeral 1 denotes a silicon semiconductor substrate. Trench capacitors GK1, GK2, which have trenches G1, G2 whose electrically conductive fillings 20a, 20b form first capacitor electrodes, are provided in the semiconductor substrate 1. The conductive fillings 20a, 20b are insulated with respect to the semiconductor substrate 1 in the lower and central regions of the trench by a dielectric 30a, 30b, the substrate in turn forming the second capacitor electrodes (if appropriate in the form of a buried plate, which is not shown).

Encircling insulation collars 10a, 10b, above which buried contacts 15a, 15b which are in electrical contact with the conductive fillings 20a, 20b and the adjoining semiconductor substrate 1, are provided in the middle and upper regions of the trenches G1, G2. The buried contacts 15a, 15b are only connected to the semiconductor substrate 1 on one side (cf. FIG. 2a, b). Insulation regions 16a, 16b insulate the other side of the substrate from the buried contacts 15a, 15b and/or insulate the buried contacts 15a, 15b from the top side of the trenches G1, G2.

This allows a very high packing density of the trench capacitors GK1, GK2 and the associated select transistors, which will now be explained. In this context, reference is made primarily to the select transistor which belongs to the trench capacitor GK2, since of adjacent select transistors only the drain region D1 or the source region S3 is included in the drawing. The select transistor belonging to the trench capacitor GK2 has a source region S2, a channel region K2 and a drain region D2. The source region S2 is connected via a bit line contact BLK to a bit line (not shown) arranged above an insulation layer I. On one side, the drain region D2 is connected to the buried contact 15b. A word line WL2, which includes a gate stack GS2 and a gate insulator GI2 surrounding the gate stack, runs above the channel region K2. The word line WL2 is an active word line for the select transistor of the trench capacitor GK2.

Word lines WL1, comprising gate stack GS1 and gate insulator GI1, and word line WL3, comprising gate stack GS3 and gate insulator GI3, which are passive word lines for the select transistor of the trench capacitor GK2, run parallel and adjacent to the word line WL2. These word lines WL1, WL3 serve to drive select transistors, which are offset in the third dimension with respect to the sectional illustration shown.

It can be seen from FIG. 1 that this type of one-sided connection of the buried contact allows the trenches and the adjacent source regions or drain regions of corresponding select transistors to be arranged directly next to one another. This means that the length of a memory cell can be just 4F and the width just 2F, where F is the minimum length unit which is technically feasible (cf. FIG. 2a, b).

FIG. 2A shows a plan view of a first possible arrangement of a memory cell array comprising memory cells as shown in FIG. 1.

Reference symbol DT in FIG. 2A denotes trenches which are arranged in rows with a distance of 3F between them and in columns with a distance 2F between them. Adjacent cells are offset by 2F with respect to one another. UC in FIG. 2a denotes the area of a unit cell, which amounts to $4F \times 2F = 8F^2$. STI denotes isolation trenches which are arranged at a distance of 1F from one another in the row direction and isolate adjacent active areas from one another. Bit lines BL also run in the row direction, with a distance of 1F between them, whereas the word lines run at a distance of 1F from one another in the column direction. In this example, all the trenches DT have a contact region KS of the buried contact to the substrate on the left-hand side and an insulation region IS on the right-hand side (regions 15a, b and 16a, b, respectively, in FIG. 1).

FIG. 2B shows a second possible arrangement of a memory cell array with memory cells in accordance with FIG. 1.

In this second possible arrangement, the rows of trenches have alternating connection regions and insulation regions of the buried contacts. Therefore, in the bottom row in FIG. 2b, the buried contacts are in each case provided with a contact region KS1 on the left-hand side and with an insulation region IS1 on the right-hand side. By contrast, in the row above, all trenches DT are provided with an insulation region IS2 on the left-hand side and with a contact region KS2 on the right-hand side. This arrangement alternates in the column direction.

For DRAM memory devices with trench capacitors in sub-100 nm technologies, the resistance of the trench and of the buried contact represent a major contribution to the total RC delay and therefore determine the speed of the DRAM. The series resistance in the trench increases dramatically as a result of the relatively low conductivity and the pinch-off which is produced by an overlay shift of the STI etch.

This problem has been addressed by the introduction of highly arsenic-doped polysilicon, an improvement to the overlay between the active areas and the trench, the introduction of a self-aligned fabrication of a buried contact with connection on one side, and thinning of the nitrided contact location of the buried contact. Nevertheless, the SiN interface significantly increases the series resistance.

It would in principle be possible to use metals such as TiN for the buried contact with connection on one side. Nevertheless, this gives the problem of incorporating large quantities of metal in the immediate vicinity of electrically active components, such as for example select transistors.

SUMMARY OF THE INVENTION

The object of the present invention is to provide an improved method for fabricating a trench capacitor which is connected on one side and has a lower RC delay.

According to the invention, this object is achieved by the fabrication method given in claim 1.

The core idea of the present invention consists in the provision of a process in which a buried contact made from conductive graphite (carbon (C)) can be used in order to reduce the contact resistance at the contact surface. In particular, the C filling and C etch back following the STI formation (STI=shallow trench isolation) are integrated in the method according to the invention, thereby allowing the formation of a fully functioning buried contact which is connected on one side. Graphite has a resistivity of less than 200 $\mu\Omega$cm and is therefore comparable to metals. In the case of graphite, as with metals, it is possible to dispense with the SiN interface.

Furthermore, a CVD process allowing this material to be deposited highly conformally in the trenches is known from Chemical Vapor Deposition of highly-conductive boron-doped graphite from triphenyl boron, J. Kouvetakis et al., Carbon, Vol. 32, No. 6, pp. 1129–1132, 1994.

The subclaims give advantageous refinements and improvements to the fabrication method described in claim 1.

According to a preferred refinement, after the C filling has been etched back, an insulation cover is provided in the upper region of the trench at least up to the top side of the substrate.

According to a further preferred refinement, the filling is provided up to the top side of the insulation collar, then a nitride liner layer is deposited, and then the trench is completely filled with the filling material.

According to a further preferred refinement, after the filling material has been removed, spacers are formed at the trench walls above the insulation collar, and the spacer located above the connection region is removed, the spacer lying above the insulation region being masked by a silicon liner.

According to a further preferred refinement, the filling is provided up to the top side of the insulation collar, and then the trench is completely filled with the filling material.

According to a further preferred refinement, after the filling material has been removed, a nitride liner layer is deposited, then a silicon liner layer is deposited, then a spacer is formed in the insulation region from the silicon liner layer above the nitride liner layer, and the nitride liner layer located over the connection region is removed, the nitride liner layer located over the insulation region being masked using the spacer formed from the silicon liner layer.

According to a further preferred refinement, the filling is provided up to the top side of the insulation collar, then a nitride liner layer is deposited, then a first silicon liner layer is deposited, then a spacer is formed from the silicon liner layer in the insulation region, then a second nitride liner layer is deposited, and then the trench is completely filled with the filling material.

According to a further preferred refinement, after the filling material has been removed, the first and second nitride liner layers are removed apart from at a region which is masked by the spacer formed from the silicon liner layer.

According to a further preferred refinement, the filling is provided up to the top side of the hard mask, and the insulation collar is provided up to above the top side of the substrate.

According to a further preferred refinement, the filling material is removed down to the top side of the substrate, then a silicon liner layer is deposited and removed on the side of the contact region, then the insulation collar is lowered in the upper region of the trench, and then the filling is lowered to below the top side of the lowered part of the insulation collar.

Exemplary embodiments of the invention are illustrated in the drawings and are explained in more detail in the description which follows. In the drawing:

BRIEF DESCRIPTION OF THE DRAWINGS

FIG. 1 shows a diagrammatic sectional illustration of a semiconductor memory cell having a trench capacitor and a planar select transistor connected to it;

FIG. 3A–F diagrammatically depict successive stages involved in a fabrication method as a first embodiment of the present invention;

FIG. 6A–D diagrammatically depict successive stages involved in a fabrication method as a fourth embodiment of the present invention.

DETAILED DESCRIPTION OF THE INVENTION

Figure 2A:
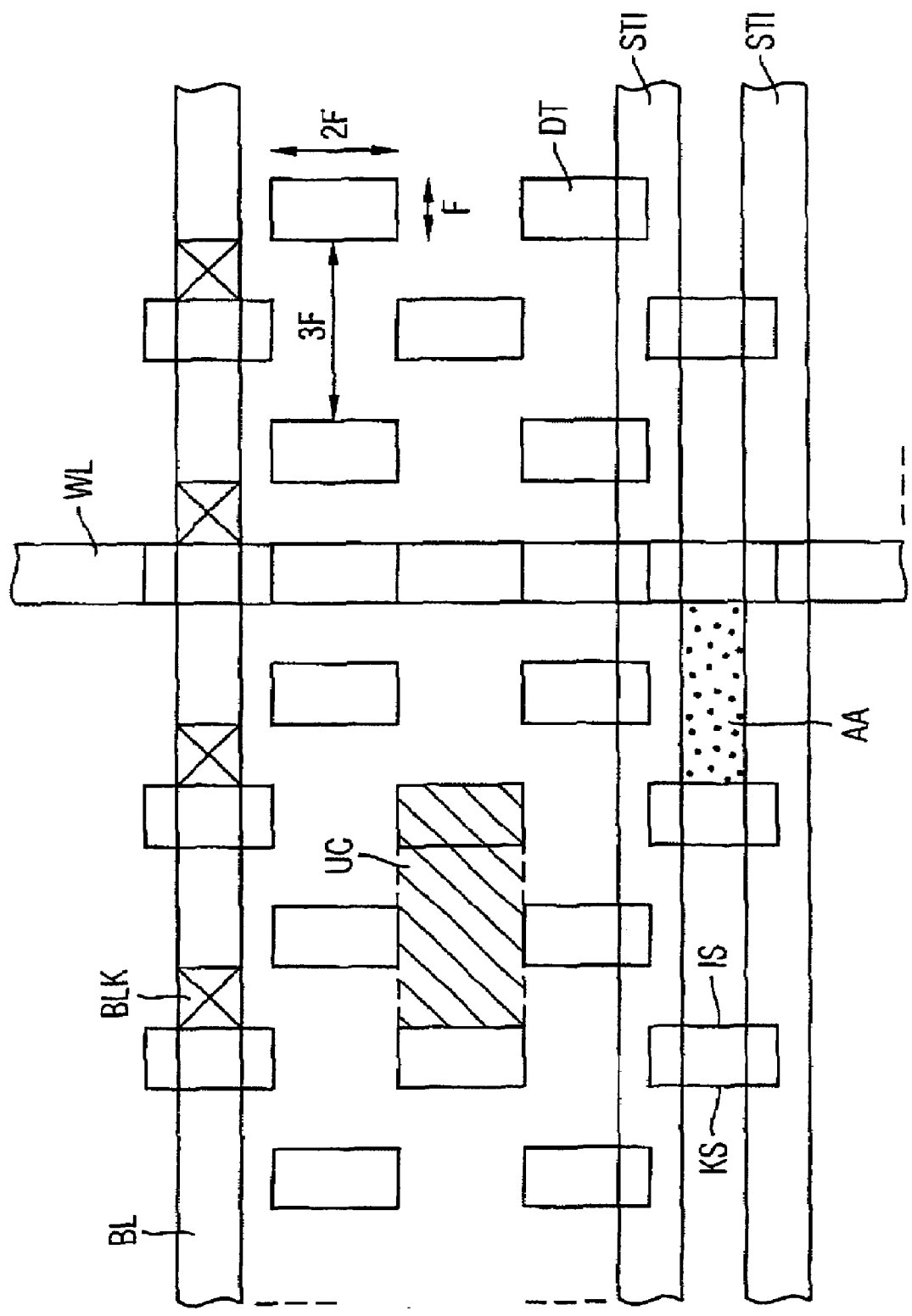
FIG. 2A, B respectively show a plan view of a first and a second possible arrangement of a memory cell array with memory cells as shown in FIG. 1.
Figure 2B:
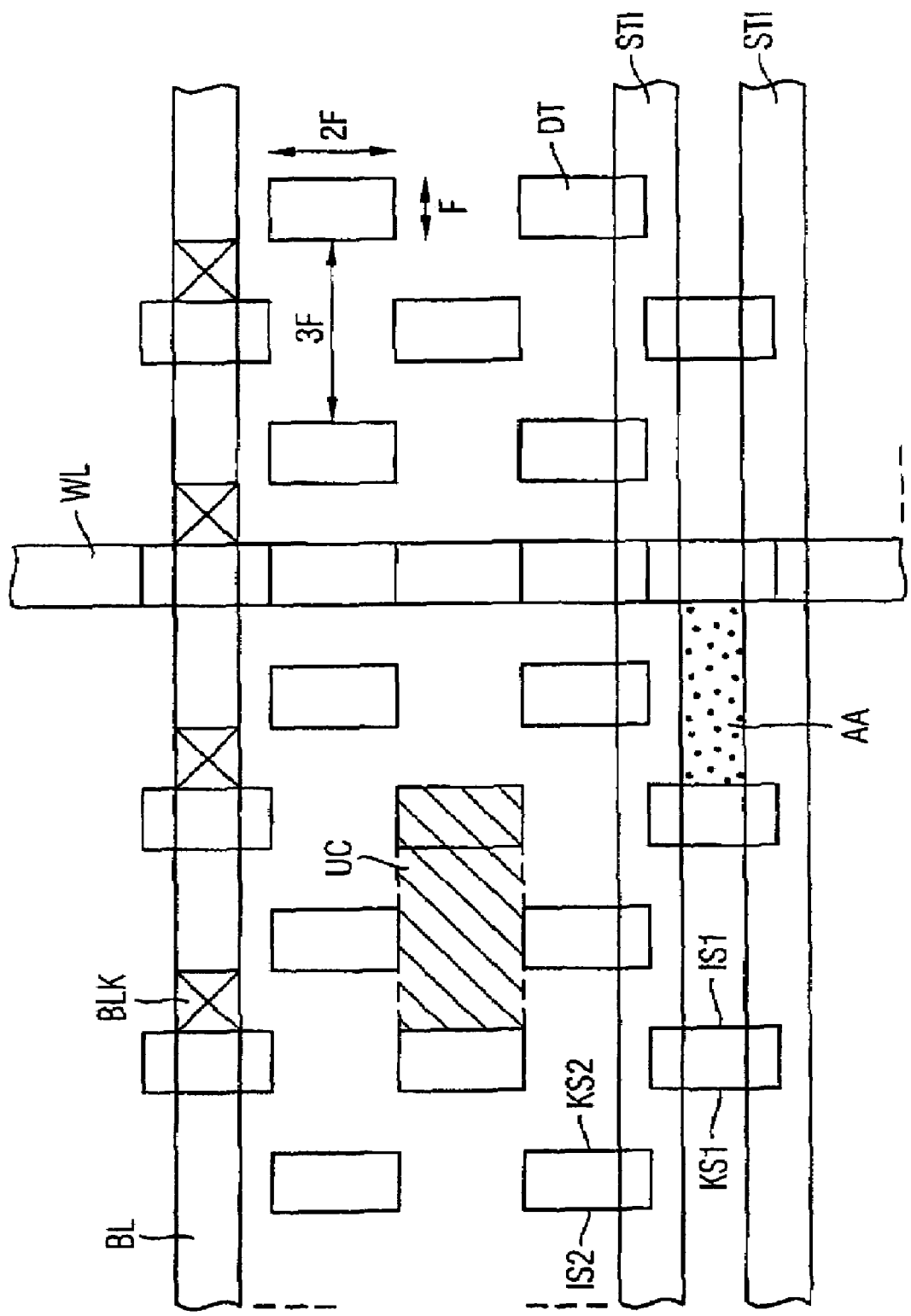

Throughout the figures, identical reference symbols denote identical or functionally equivalent components.

In the embodiments described below, the fabrication of the planar select transistors will not be outlined, for reasons of clarity, but rather only the formation of the buried contact, which is connected on one side, of the trench capacitor will be explained in detail. Unless expressly stated otherwise, the steps used to fabricate the planar select transistors are the same as those used in the prior art.

FIG. 3A–F diagrammatically depict successive stages involved in a fabrication method as a first embodiment of the present invention.

In FIG. 3A, reference numeral 5 denotes a trench which is provided in the silicon semiconductor substrate 1. A hard mask, comprising a pad oxide layer 2 and a pad nitride layer 3, is provided on the top side OS of the semiconductor substrate 1. A dielectric 30, which insulates an electrically conductive filling 20 from the surrounding semiconductor substrate 1, is provided in the lower and middle regions of the trench 5. An encircling insulation collar 10, which is recessed into the trench 5 to approximately the same height as the conductive filling 20, is provided in the upper and middle regions of the trench 5. One example of a material for the insulation collar 10 is silicon oxide, and one example of a material for the electrically conductive filling 20 is polysilicon. However, it is, of course, also conceivable to use other combinations of materials.

Figure 3B:
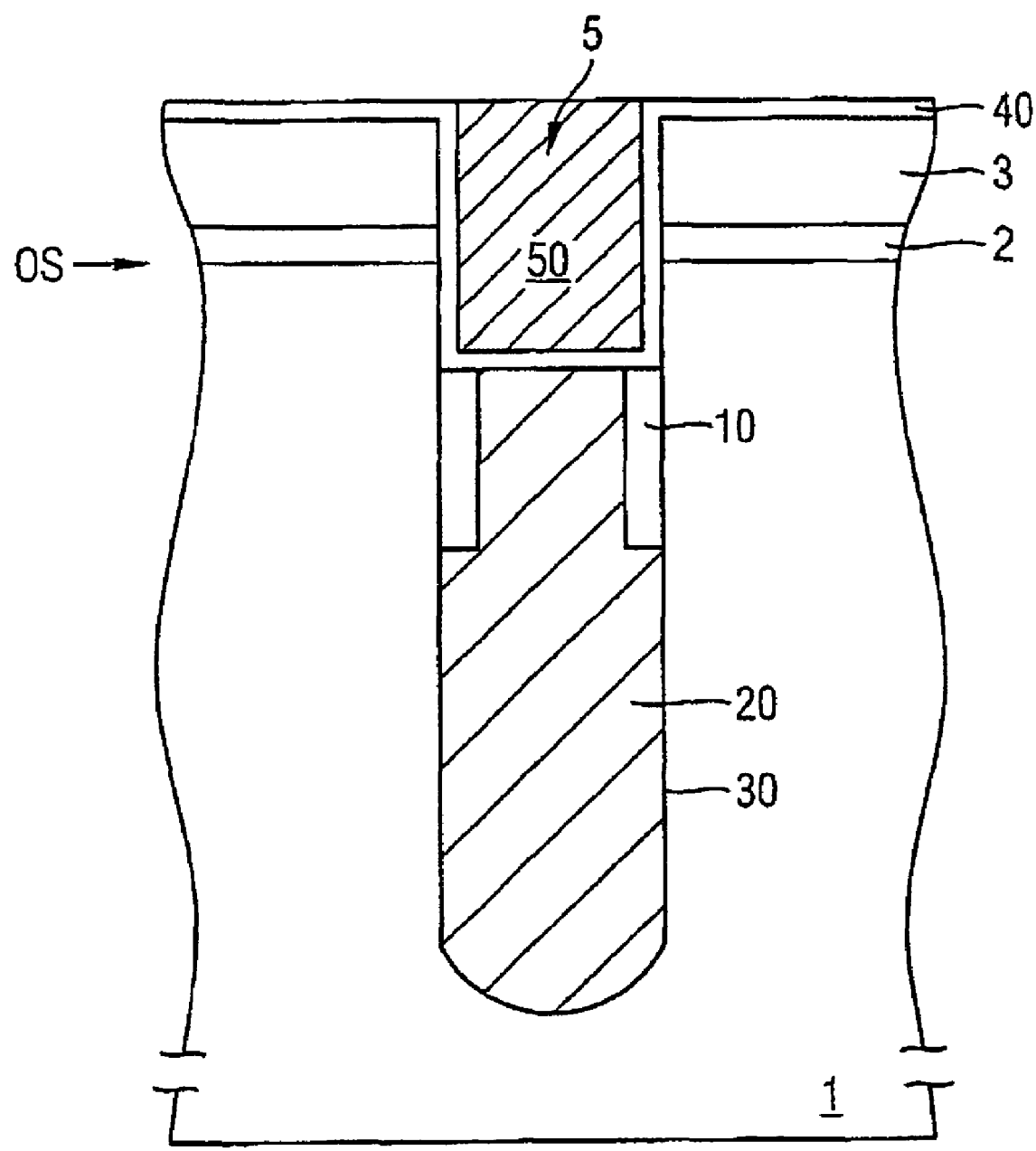

In accordance with FIG. 3B, first of all a liner layer 40 is deposited over the structure shown in FIG. 3A, the liner layer consisting of silicon nitride or silicon nitride/silicon oxide. Then, the trench 5 is closed up again by a polysilicon filling 50, for example by deposition followed by chemical mechanical polishing.

In a subsequent process step, which is not illustrated in the figures, a hard mask is then formed over the structure corresponding to STI trenches that are to be formed in parallel planes in front of and behind the plane of the drawing, after which the STI trenches are etched and filled (high-temperature process). Then, the hard mask for forming the STI trenches is removed again.

The purpose of this advanced high-temperature step is to prevent the high-temperature step from influencing the buried contact which is then to be formed at a later stage.

Figure 3C:
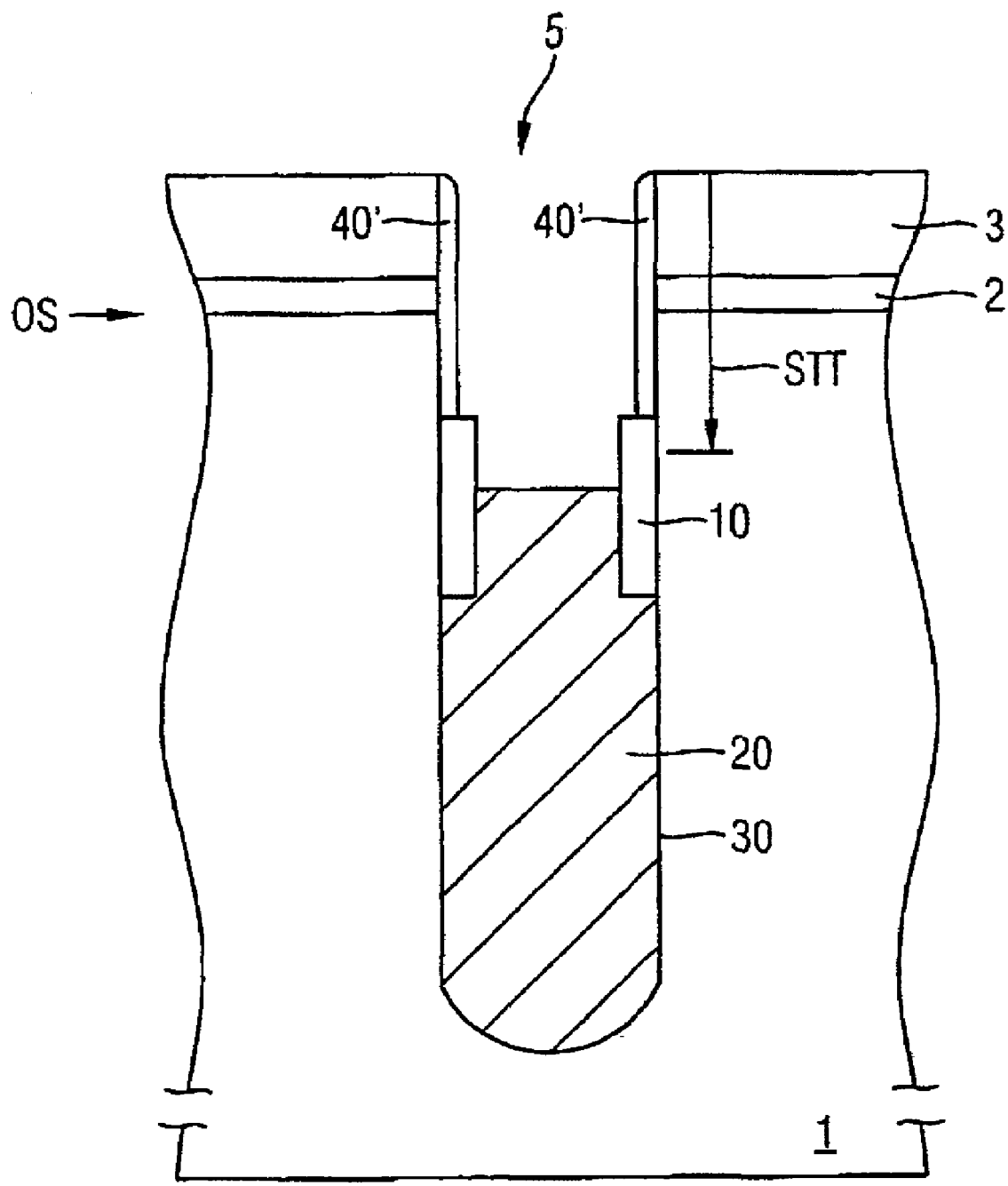

Continuing by referring to FIG. 3C, in which STT denotes the STI trench depth, the polysilicon filling 50 is then removed by means of a wet etch, and an anisotropic spacer etch of the liner layer 40 made from silicon nitride is carried out in order to form liners 40'. As can be seen from FIG. 3C, during the etch back of the polysilicon filling, the trench polysilicon filling 20 is also etched back to below the top side of the insulation collar 10, so that the STI trench depth STT is between the top side of the insulation collar 10 and the top side of the trench polysilicon filling 20.

Figure 3D:
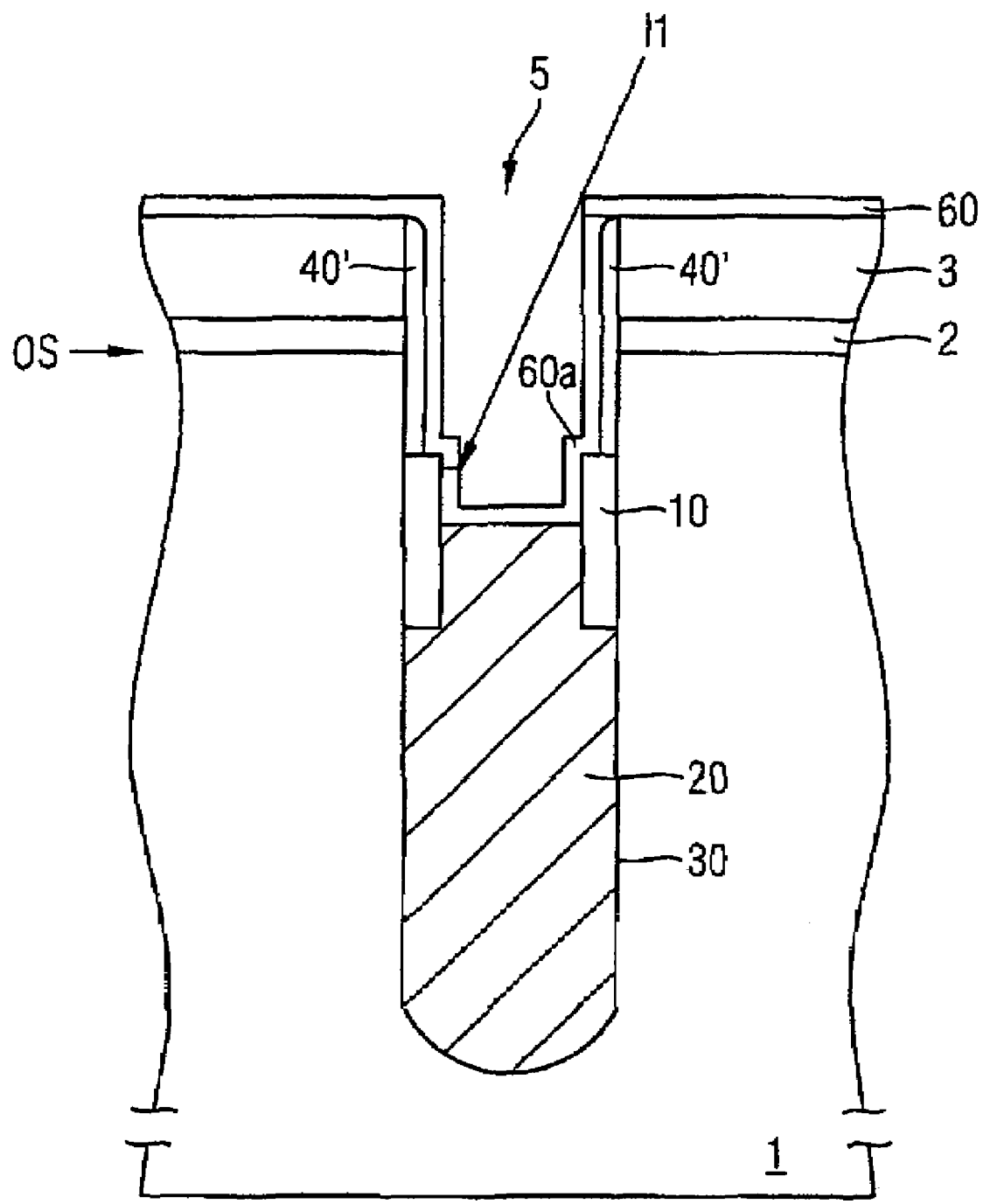

Then, referring now to FIG. 3D, an amorphous silicon liner 60 is deposited over the resulting structure, and boron ions are implanted into this liner 60 by means of oblique implantation I1, reference numeral 60a denoting a region which is shadowed from the implantation. The region 60a of the silicon liner 60 which is shadowed from the implantation has a higher etching rate when subjected to an $NH_4OH$ etch, which is carried out as the next process step.

Referring now to FIG. 3E, an $NH_4OH$ etch is able to remove the region 60a selectively with respect to the remaining, implanted region of the silicon liner 60.

In a subsequent process step, a selective etch of the uncovered region of the nitride liner 40' located on the right-hand side of the figure is carried out, in order to uncover what will subsequently be the contact region KS of the buried contact.

Figure 3F:
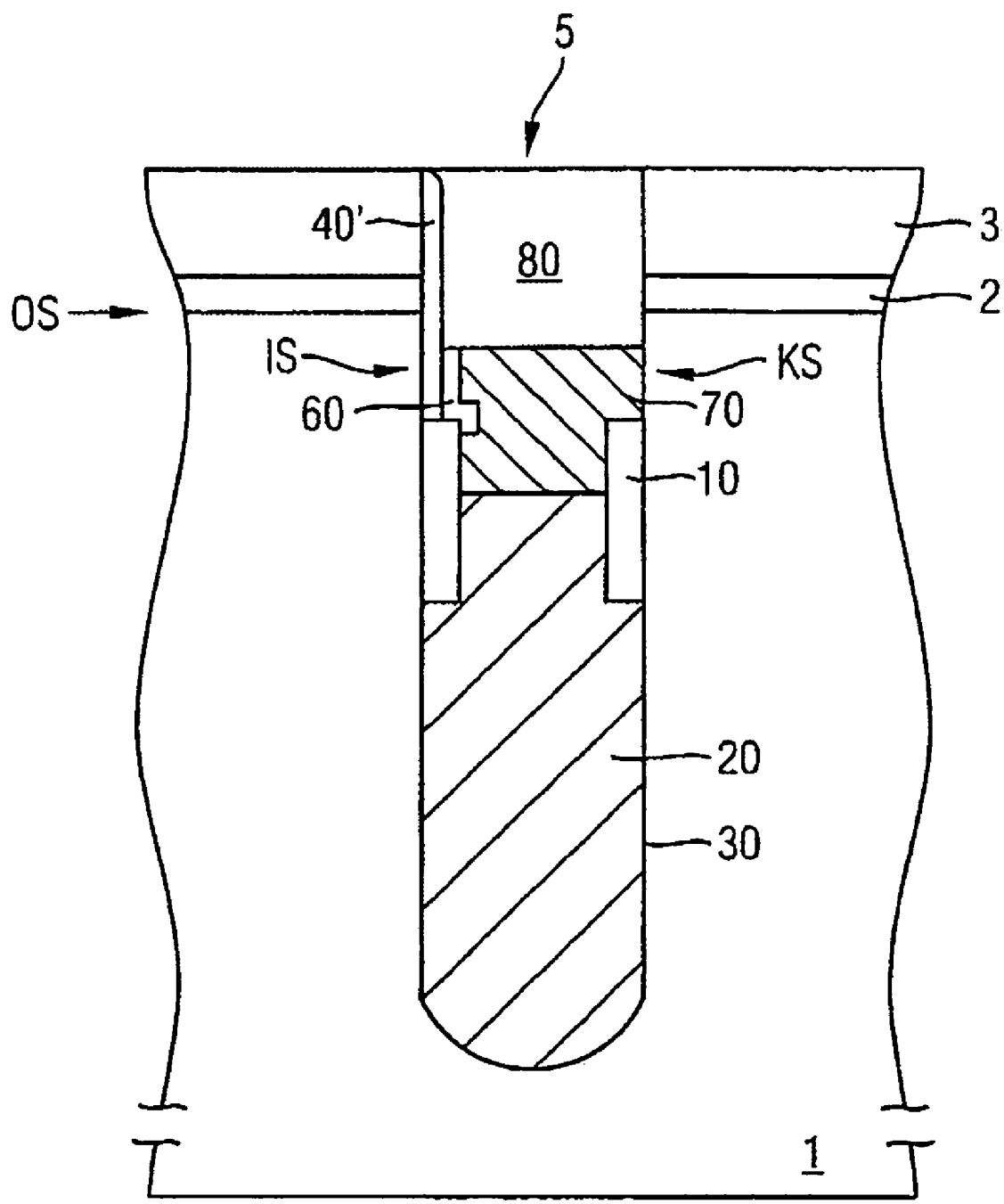

Referring now to FIG. 3F, a conditioning implantation is carried out into the contact region KB, followed by deposition and etch back of a conductive C filling 70 in order to form the buried contact. During the etch back of the C filling 70, for example in an oxygen-containing plasma, the remaining silicon liner 60 is also etched back.

Finally, the trench 5 is filled with an insulation cover 80, consisting, for example, of silicon oxide, in a known way.

FIG. 4A–E diagrammatically depict successive stages involved in a fabrication method as a second embodiment of the present invention.

The starting point for the second embodiment differs from the starting point of the first embodiment in that the trench 5 has been filled with a polysilicon filling 50' without a liner previously having been provided in the trench.

The hard mask for the STI trenches, the etching and filling of the STI trenches and the removal of the corresponding hard mask are then carried out in the same way as has already been explained with reference to the first embodiment, and are not illustrated.

Figure 4A:
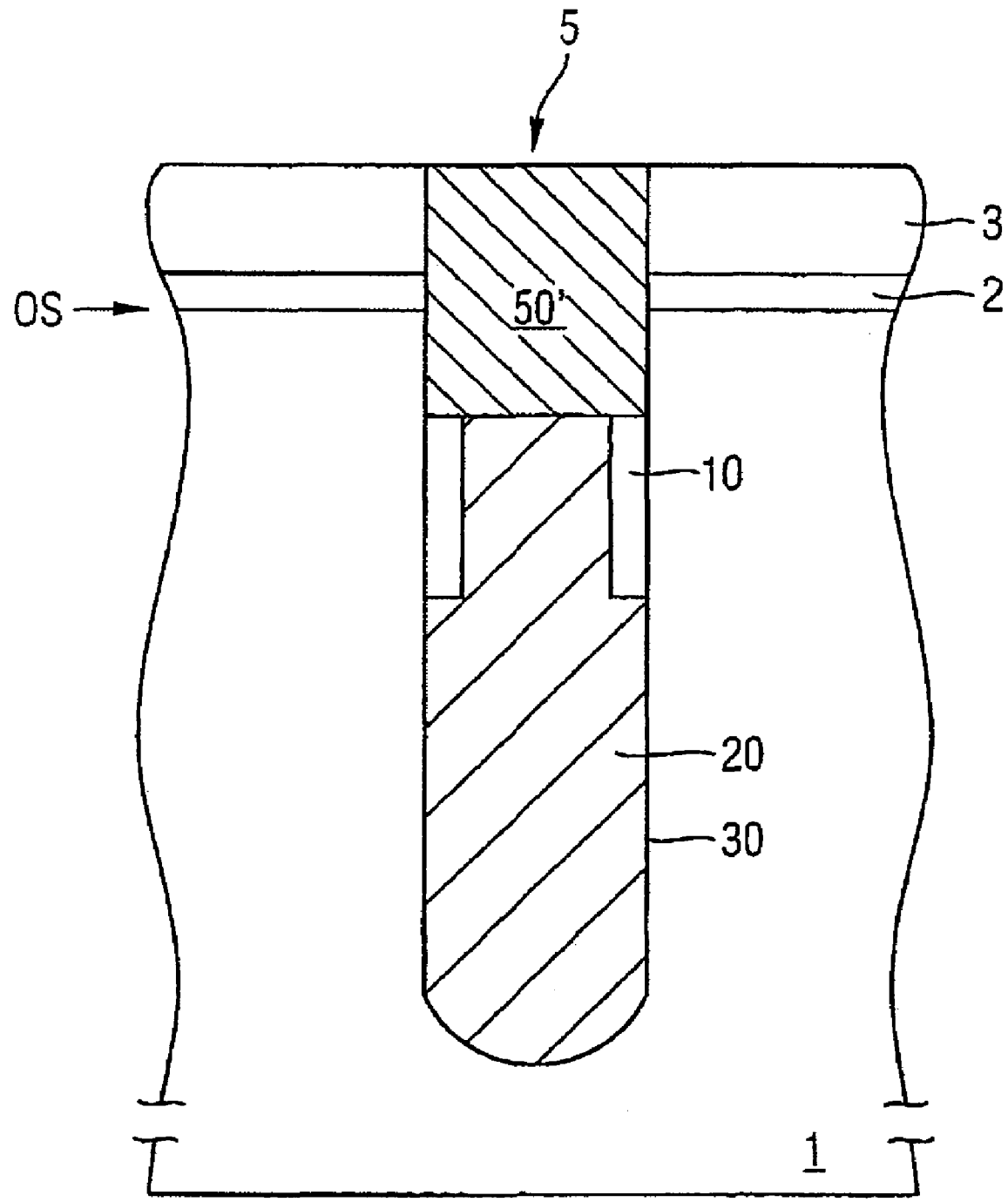
FIG. 4A–E diagrammatically depict successive stages involved in a fabrication method as a second embodiment of the present invention.
Figure 4B:
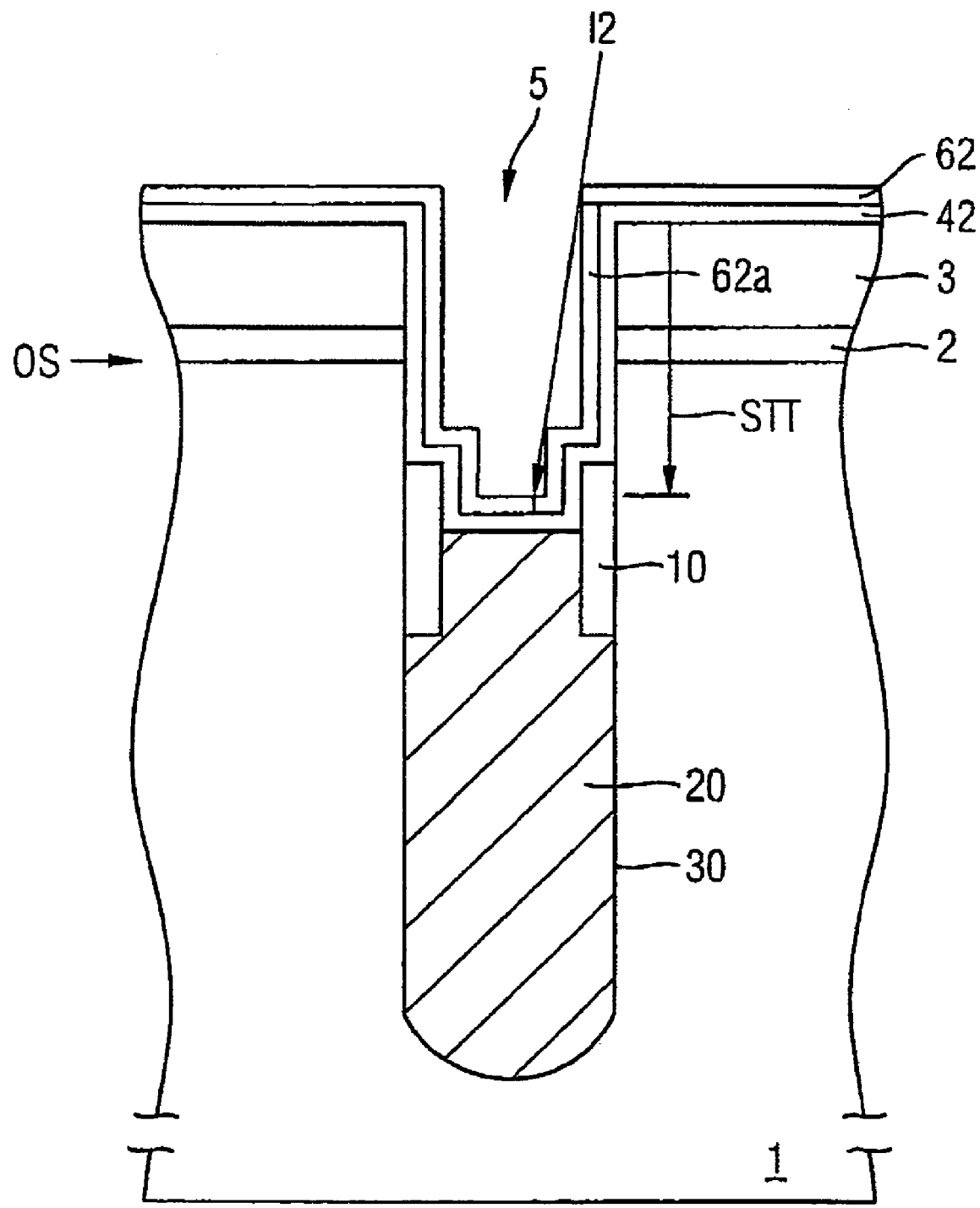

Then, referring to FIG. 4B, the polysilicon filling 50' is removed and the polysilicon filling 20 beneath it is etched back to below the top side of the insulation collar 10.

Then, a first liner layer 42 of silicon nitride and a second liner layer 62 of amorphous silicon are deposited. This is followed by an oblique implantation I2 of boron ions into the liner layer 62 of silicon, with a region 62a remaining shadowed from the implantation I2. As has already been explained with reference to the first embodiment, this implantation I2 creates etching selectivity for the shadowed region 62a.

Figure 4C:
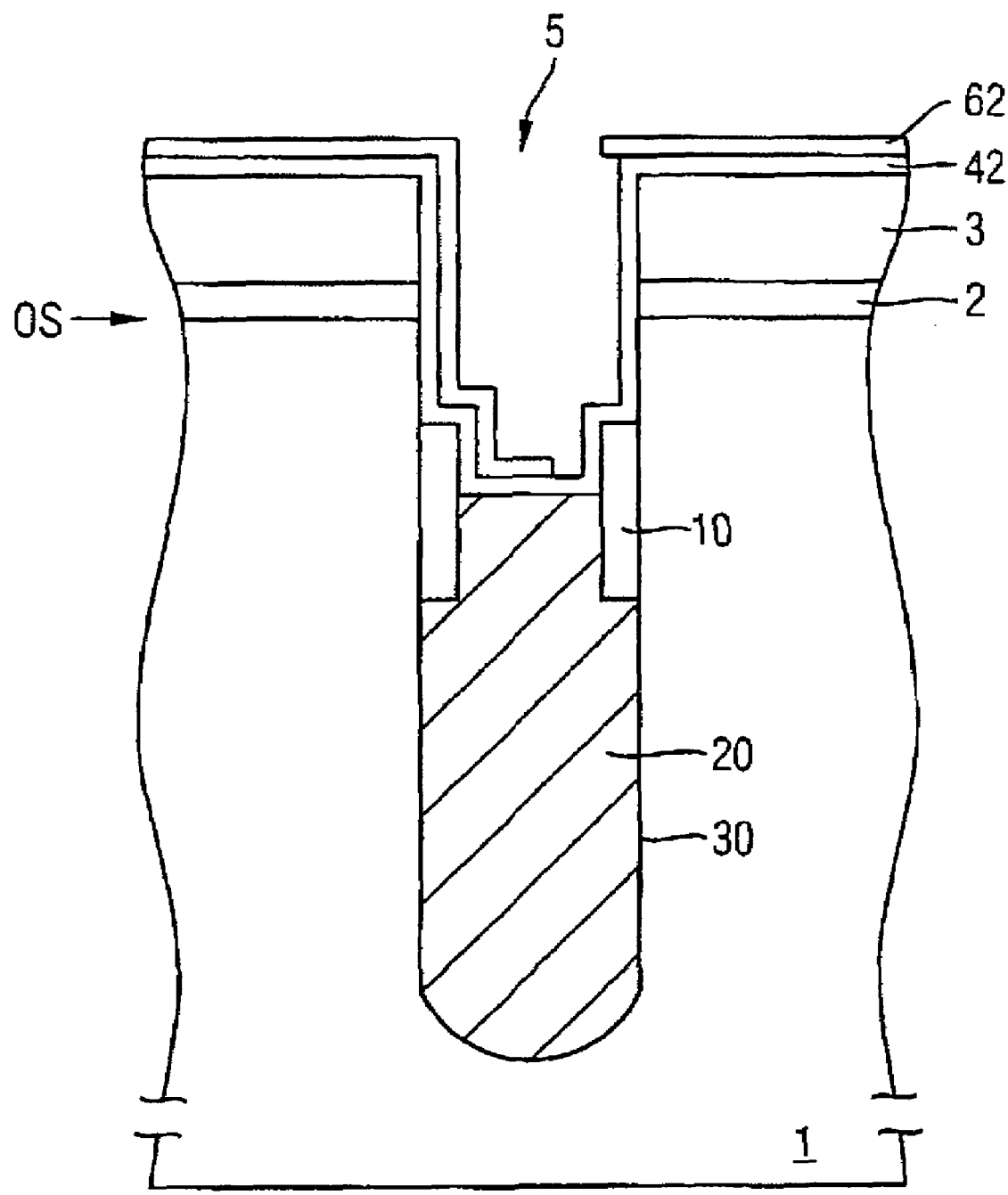
Figure 4D:
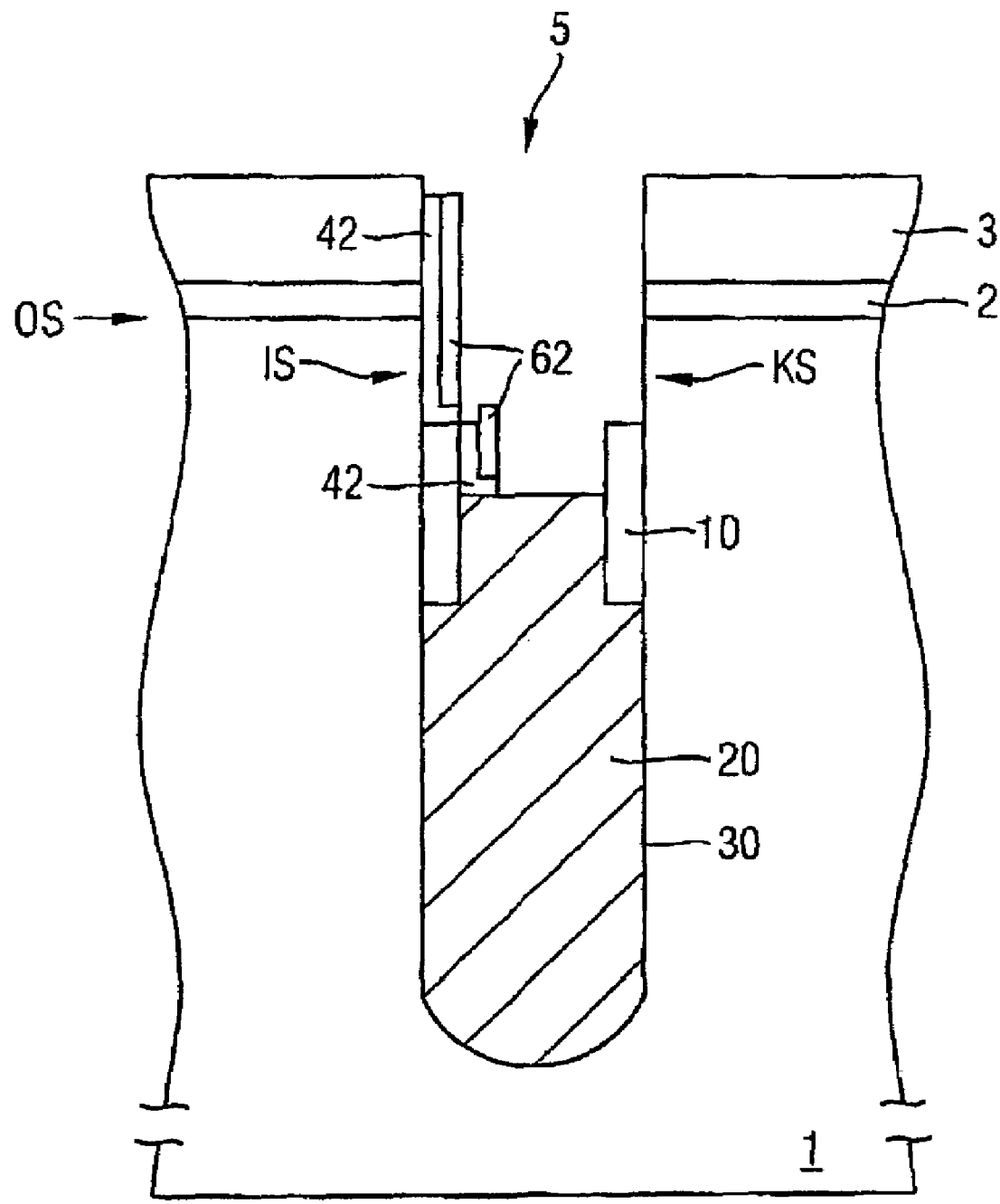

Accordingly, the region 62a, as shown in FIG. 4C, is removed by an $NH_4OH$ etch in the next process step. Then, referring now to FIG. 4D, a spacer etch is carried out on the liner layer 62 formed from silicon, followed by etching of the liner layer 42 formed from silicon nitride, in order to uncover what will subsequently be the contact region KS of the buried contact with the substrate 1 and at the same time to leave the opposite insulation region IS in place. This leads to the process state shown in FIG. 4D.

Figure 4E:
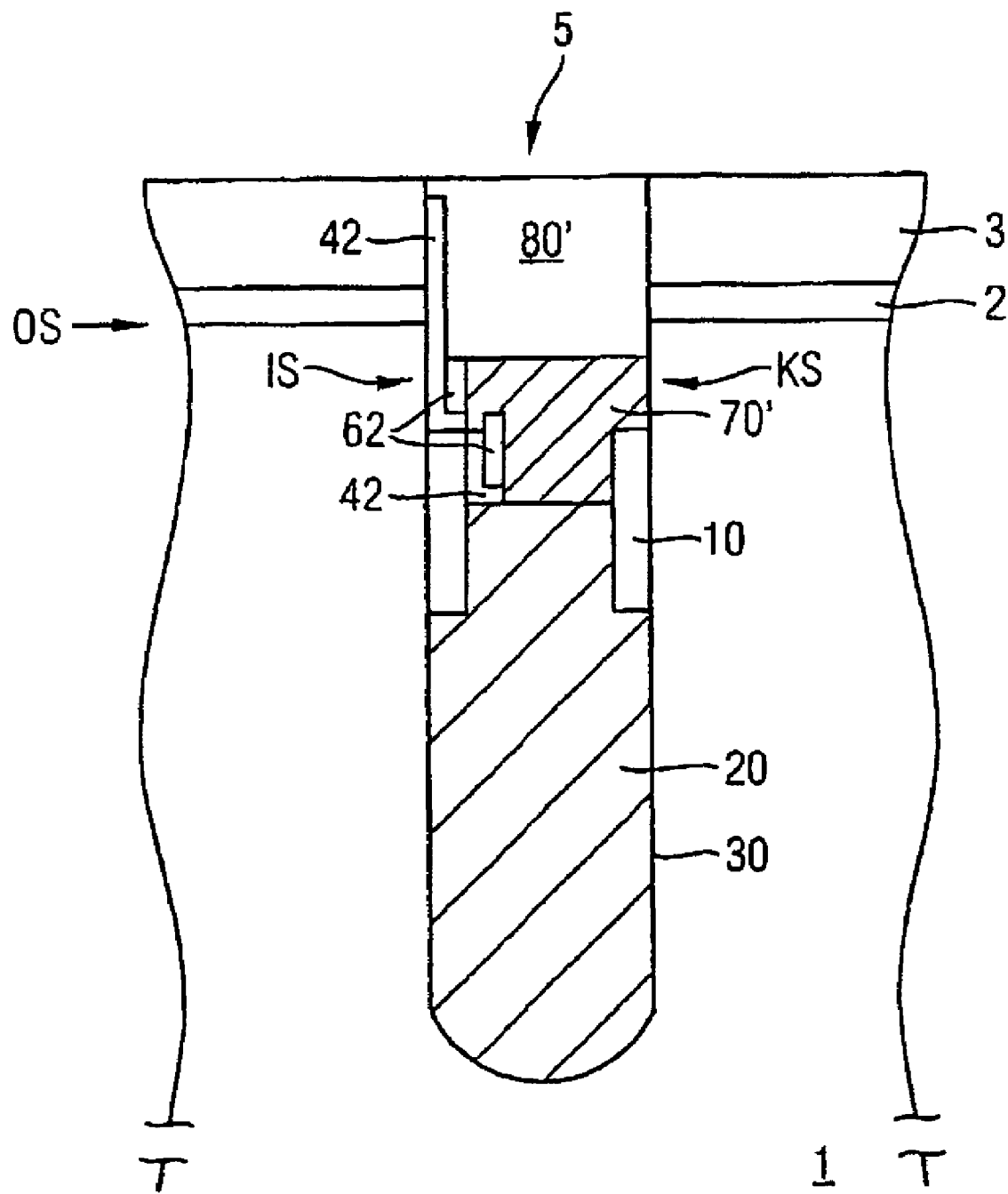

Referring now to FIG. 4E, the contact region KB is then conditioned by a corresponding implantation, for example with arsenic, followed by filling with conductive C 70', which is etched back in order to form the buried contact. During the etch back, the liner layer 62 formed from silicon is likewise etched back.

Finally, as in the first embodiment, an insulation cover 80' of silicon oxide is provided in order to close off the trench.

Figure 5A:
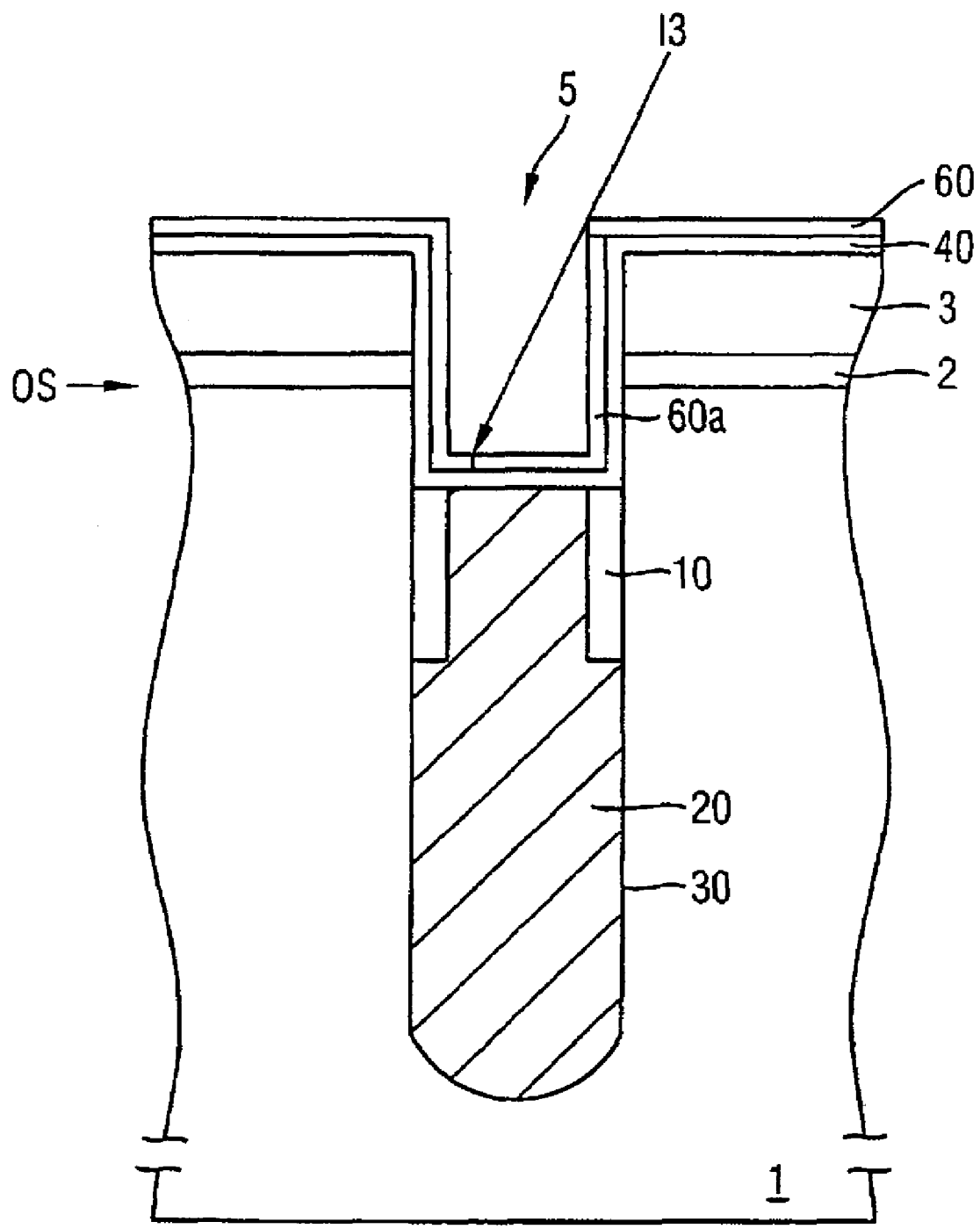
FIG. 5A–C diagrammatically depict successive stages involved in a fabrication method as a third embodiment of the present invention.
Figure 5B:
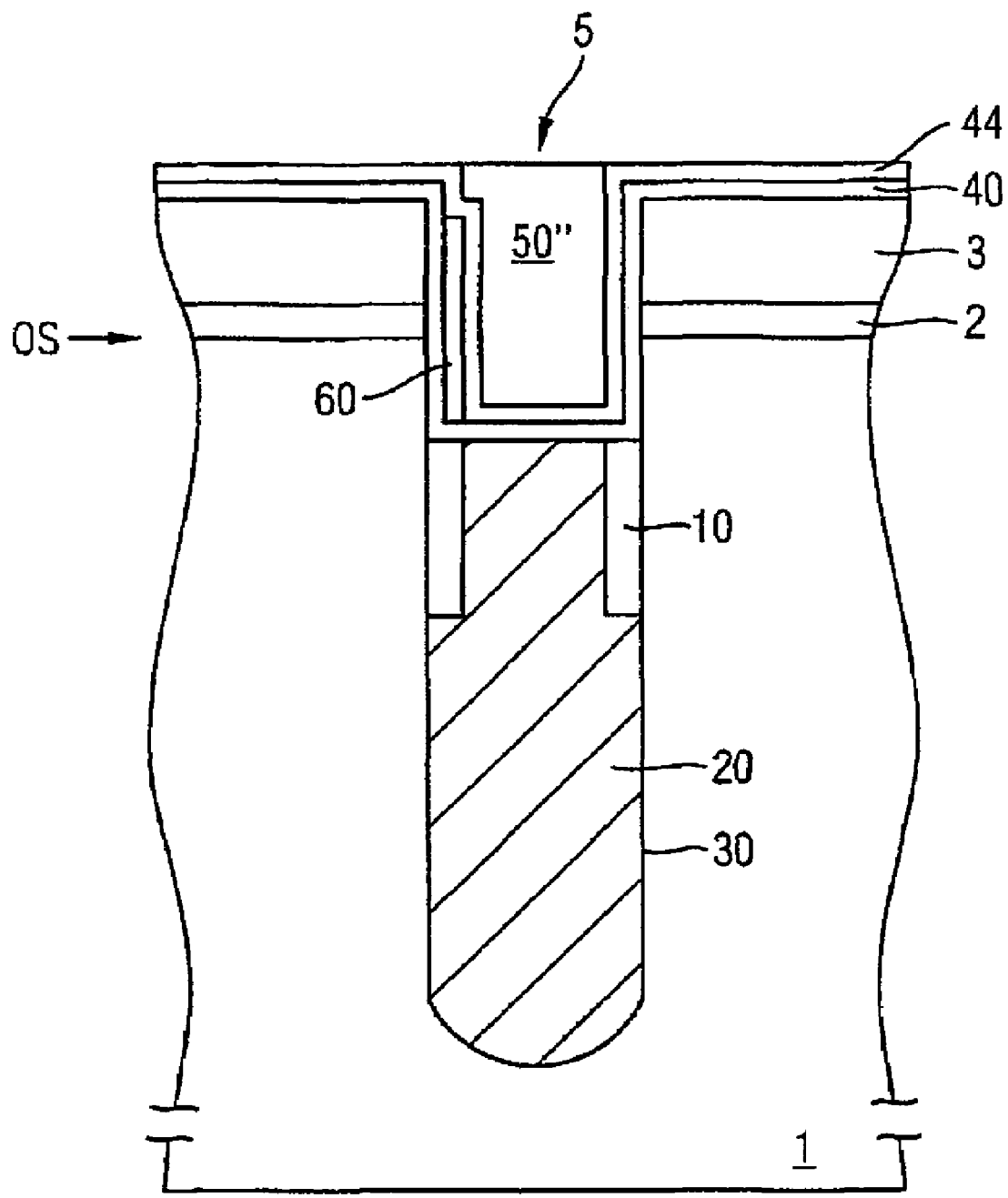
Figure 5C:
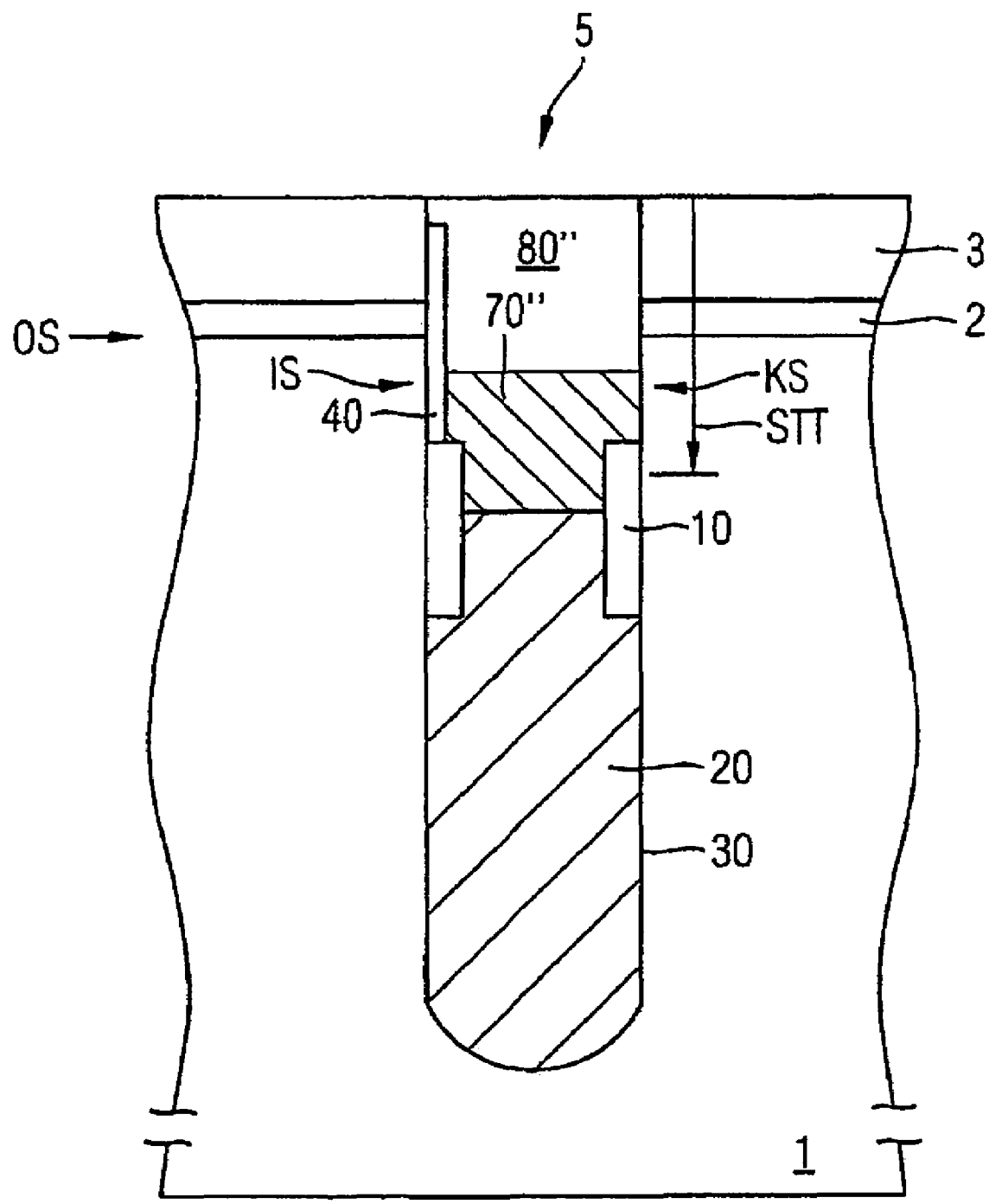

FIG. 5A–C diagrammatically depict successive stages involved in a fabrication method as a third embodiment of the present invention.

The starting point for the third embodiment shown in FIG. 5A is the same as the starting point for the first embodiment, and a second liner layer 60 formed from amorphous silicon is deposited directly over the liner layer 40 following the deposition of the liner layer 40 formed from silicon nitride. Then, an oblique implantation I3 of boron ions is carried out into the liner layer 60 formed from silicon, with a region 60a remaining shadowed from the implantation A3. As has already been explained with reference to the first embodiment, this implantation I3 creates etching selectivity for the shadowed region 60A. Then, the region 60A is removed by etching.

Next, an anisotropic spacer etch of the silicon liner layer 60 and the deposition of a further liner layer 44 formed from silicon oxide are carried out. Finally, the trench 5 is filled again with a polysilicon filling 50", leading to the process state shown in FIG. 5B.

As the process continues, the STI trench process is carried out, as has already been explained in detail in connection with the first and second embodiments, and then the polysilicon filling 50" and the uncovered regions of the silicon nitride liner 40 are removed.

Then, the polysilicon filling 20 is etched back to below the top side of the insulation collar 10. This is followed by the deposition and etch back of a conductive C filling 70' in order to form the buried contact. As in the other embodiments which have been described above, the trench 5 is then closed again by means of an insulation cover 80" formed from silicon oxide.

In this embodiment too, moreover, a conditioning implantation into the contact region KS can be carried out prior to the filling with C.

FIG. 6A–D diagrammatically depict successive stages involved in a fabrication method as a fourth embodiment of the present invention.

The fourth embodiment shown in FIG. 6A, unlike the embodiments described above, commences in a process state in which the insulation collar 10 has not yet been recessed into the trench 5, as illustrated in FIG. 6A.

Starting from the process state illustrated in FIG. 6A, the STI isolation trench formation process is then carried out, as has already been explained above in connection with the other embodiments.

Figure 6B:
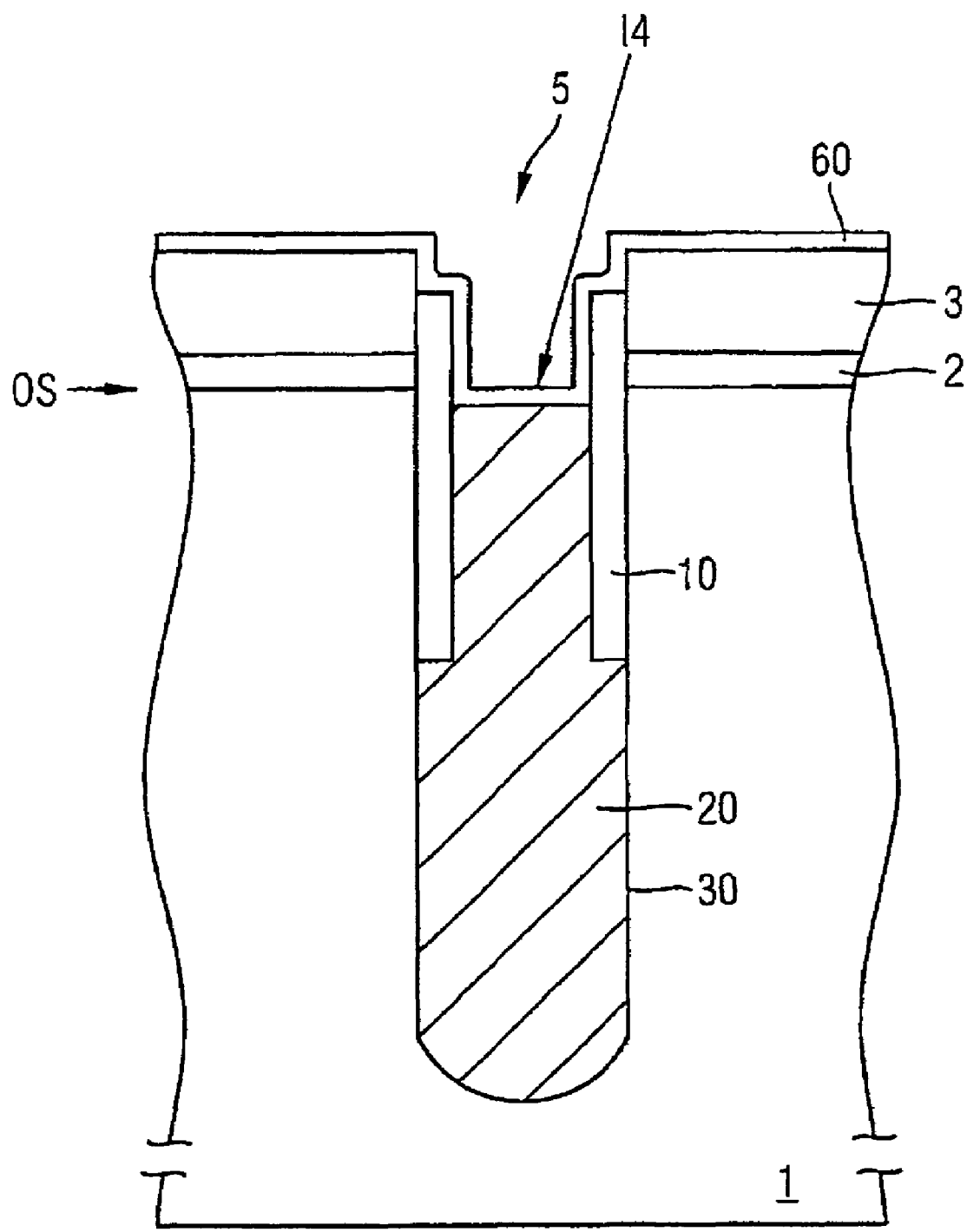

Then, in accordance with FIG. 6B, the polysilicon filling 20 is recessed to below the top side of the substrate OS.

Then, a liner layer 60 formed from silicon is deposited over the resulting structure. In this embodiment too, an oblique implantation I4 with boron ions is then carried out in the trench 5, with a region 60a of the silicon liner 60 remaining shadowed, as illustrated in FIG. 6b.

Figure 6C:
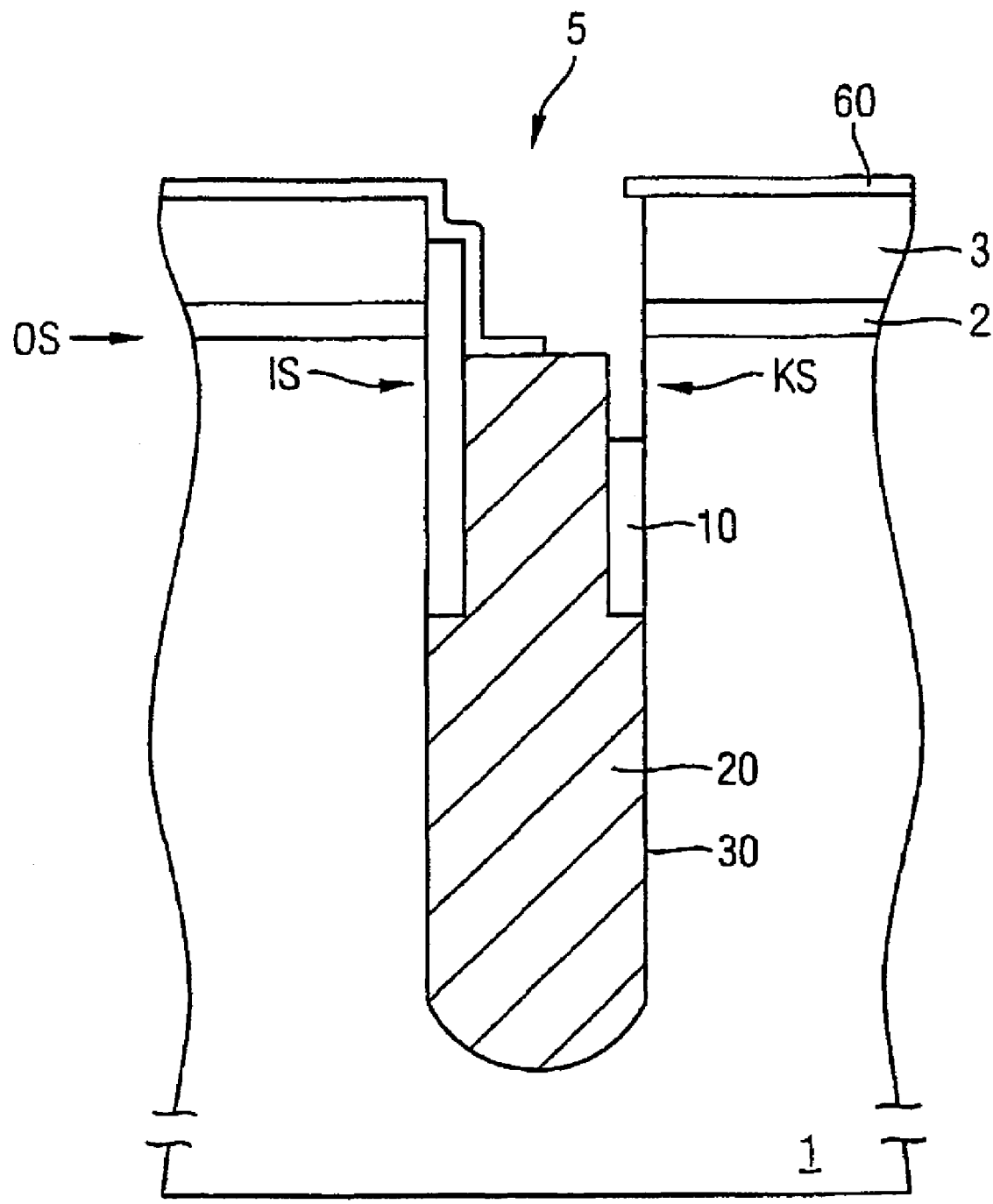

Referring now to FIG. 6C, a selective etch of the region 60a is then carried out in Na$_4$OH, followed by selective removal of the insulation collar 10 in what will subsequently be the contact region KB of the buried contact.

This is followed by an etch in which the remaining liner 60 is removed and then the polysilicon filling 20 is recessed further, to below the insulation collar on the right-hand side of the figure. This is followed, as described above, by filling of the trench with C and etch back of the C filling 70''' to create the buried contact. Likewise, in exactly the same way as the embodiments described above, the trench 5 is then closed up again by means of an insulation cover 80''' formed from silicon oxide.

Although the present invention has been described above on the basis of a preferred exemplary embodiment, it is not restricted to this embodiment, but rather can be modified in numerous ways.

In particular, the choice of layer materials is merely given by way of example and can be varied in numerous ways.

What is claimed is:

1. A method for fabricating a trench capacitor having an insulation collar in a substrate, which is electrically connected to the substrate on one side via a buried contact, in particular for a semiconductor memory cell having a planar select transistor which is provided in the substrate and is connected via the buried contact, comprising the steps of:
   (a) providing a trench in the substrate using a hard mask with a corresponding mask opening;
   (b) providing a capacitor dielectric in the lower and middle regions of the trench, the insulation collar in the middle and upper regions of the trench and an electrically conductive filling at least up to the top side of the insulation collar;
   (c) filling completely the trench with a filling material;
   (d) carrying out an STI trench production process;
   (e) removing the filling material and lowering the electrically conductive filling to below the top side of the insulation collar;
   (f) forming an insulation region on one side with respect to the substrate above the insulation collar;
   (g) uncovering a connection region on the other side with respect to the substrate above the insulation collar; and
   (h) forming the buried contact by depositing and etching back a C filling.

2. Method according to claim 1, wherein after the C filling has been etched back, an insulation cover is provided in the upper region of the trench at least up to the top side of the substrate.

3. Method according to claim 1, wherein the filling is provided up to the top side of the insulation collar, then a nitride liner layer is deposited, and then the trench is completely filled with the filling material.

4. Method according to claim 3, wherein after the filling material has been removed, spacers are formed at the trench walls above the insulation collar, and the spacer located above the connection region is removed, the spacer lying above the insulation region being masked by a silicon liner.

5. Method according to claim 1, wherein the filling is provided up to the top side of the insulation collar, and then the trench is completely filled with the filling material.

6. Method according to claim 5, wherein after the filling material has been removed, a nitride liner layer is deposited, then a silicon liner layer is deposited, then a spacer is formed in the insulation region from the silicon liner layer above the nitride liner layer, and the nitride liner layer located over the connection region is removed, the nitride liner layer located over the insulation region being masked using the spacer formed from the silicon liner layer.

7. Method according to claim 1, wherein the filling is provided up to the top side of the insulation collar, then a nitride liner layer is deposited, then a first silicon liner layer is deposited, then a spacer is formed from the silicon liner layer in the insulation region, then a second nitride liner layer is deposited, and then the trench is completely filled with the filling material.

8. Method according to claim 7, wherein after the filling material has been removed, the first and second nitride liner layers are removed apart from at a region which is masked by the spacer formed from the silicon liner layer.

9. Method according to claim 7, wherein the filling material is removed down to the top side of the substrate, then a silicon liner layer is deposited and removed on the side of the contact region, then the insulation collar is lowered in the upper region of the trench, and then the filling is lowered to below the top side of the lowered part of the insulation collar.

10. Method according to claim 1, wherein the filling is provided up to the top side of the hard mask, and the insulation collar is provided up to above the top side of the substrate.

* * * * *